(12) United States Patent
Zach

(10) Patent No.: US 7,781,742 B2
(45) Date of Patent: Aug. 24, 2010

(54) CORRECTOR

(75) Inventor: Joachim Zach, Oestringen (DE)

(73) Assignee: CEOS Corrected Electron Optical Systems GmbH, Heidelberg (DE)

( * ) Notice: Subject to any disclaimer, the term of this patent is extended or adjusted under 35 U.S.C. 154(b) by 298 days.

(21) Appl. No.: 12/213,493

(22) Filed: Jun. 20, 2008

(65) Prior Publication Data

US 2009/0101818 A1 Apr. 23, 2009

(30) Foreign Application Priority Data

Oct. 20, 2007 (DE) .................... 10 2007 049 816

(51) Int. Cl.
*H01J 37/153* (2006.01)
*H01J 37/26* (2006.01)
*H01J 37/28* (2006.01)

(52) U.S. Cl. .................... 250/396 R; 250/310; 250/311

(58) Field of Classification Search ............ 250/396 R, 250/396 ML, 398, 310, 311
See application file for complete search history.

(56) References Cited

U.S. PATENT DOCUMENTS

| 7,015,481 | B2 | 3/2006 | Matsuya | |
|---|---|---|---|---|
| 7,095,031 | B2* | 8/2006 | Uno | 250/396 R |
| 7,211,804 | B2* | 5/2007 | Yoshida et | 250/396 R |
| 7,321,124 | B2* | 1/2008 | Rose | 250/396 ML |
| 2008/0283749 | A1* | 11/2008 | Muller et al. | 250/311 |
| 2009/0146056 | A1* | 6/2009 | Zach et al. | 250/311 |

FOREIGN PATENT DOCUMENTS

WO    WO 2007/065382    6/2007

OTHER PUBLICATIONS

O. Schwerzer "Spaerische und chromatische Korrektur von Elektronen-Linsen". Optik, DE, Jena, 1947, PA. 114-132, XP002090897, ISSN: 0863-0259.

(Continued)

*Primary Examiner*—Jack I Berman
(74) *Attorney, Agent, or Firm*—Paul Vincent

(57) ABSTRACT

The invention concerns a corrector (10) for chromatic and aperture aberration correction in a scanning electron microscope or a scanning transmission electron microscope, comprising four multipole elements (1, 2, 3, 4) which are consecutively disposed in the optical path (9), the first (1) and fourth (4) of which are used to generate quadrupole fields (5, 6) and the second (2) and third (3) of which are used to generate octupole fields (11, 12) and quadrupole fields (7, 7', 8, 8'), wherein the latter are superposed magnetic (7, 8) and electric (7', 8') fields, and wherein the quadrupole fields (5, 6, 7, 8) of all four multipole elements (1, 2, 3, 4) are successively rotated with respect to one another through 90°. Elimination of errors up to fifth order can be realized with a corrector (10) of this type in that the second (2) and the third (3) multipole elements are designed as twelve-pole elements, and an additional twelve-pole element (13) is inserted between the second (2) and the third (3) multipole element, and is loaded with current and/or voltage, such that an octupole field (14) is generated that is superposed by a twelve-pole field (15).

6 Claims, 3 Drawing Sheets

OTHER PUBLICATIONS

V. Beck and A.V. Crewe "A quadrupole-octupole corrector for a 100 keV STEM". Proceedings 32nd Annual EMSA Meeting, 1974, pp. 426, 427.

H. Rose "Abbildungseigenschaften spaerisch korrigierter elektronenoptischer Achromate". Optik, Special Edition, vol. 33, (1971), pa. 1-24.

J. Zach and M. Haider "Aberration correction in a low voltage SEM by a multipole corrector". Nuclear Instruments and Methods in Physics Research A 363 (1995) 316-325.

D.E. Williams, C. B. Carter "Transmission Electron Microscopy". Springer Publishing Company.

* cited by examiner

CORRECTOR

This application claims Paris Convention priority of DE 10 2007 049 816.2 filed Oct. 20, 2007 the complete disclosure of which is hereby incorporated by reference.

BACKGROUND OF THE INVENTION

The invention concerns a corrector for chromatic and aperture aberration correction in a scanning electron microscope or a scanning transmission electron microscope, comprising four multipole elements which are consecutively disposed in the optical path, the first and fourth of which generating quadrupole fields, and the second and third of which generating octupole fields and quadrupole fields, wherein the latter are superposed magnetic and electric fields, and wherein the quadrupole fields of all four multipole elements are successively rotated from one to the other through 90°, such that chromatic aberration correction can be performed in the second and third multipole elements using astigmatic intermediate images through interaction between the magnetic and electric fields, and aperture aberration correction can be performed using quadrupole fields and octupole fields.

A corrector of this type changes the beam emitted by the beam source prior to reaching the scanning device after passage through a condenser lens in such a fashion that the chromatic and aperture aberrations of the round lenses of the microscope can be compensated for. This minimizes and exactly defines the scanning point. This is the precondition for generating scanning images of high resolution and high contrast.

The findings of O. Scherzer (O. Scherzer: "Sphärische und chromatische Korrektur von Elektronen-Linsen" (spherical and chromatic correction of electron lenses), OPTIK, DE, JENA, 1947, pages 114-132, XP002090897, ISSN: 0863-0259) form the basis of function of all correctors in particle optics, i.e. that chromatic and aperture aberrations can also be corrected for particle beams by using non-rotationally symmetrical fields that first generate astigmatic intermediate images and then eliminate this astigmatism. O. Scherzer establishes the conditions required to achieve this (cit. loc.). These conditions, which are called the Scherzer theorem, form the basis of any chromatic and aperture aberration correction in particle optics.

Departing therefrom, V. Beck and A. V. Crewe (V. Beck and A. V. Crewe, "A quadrupole-octupole corrector for a 100 keV STEM", Proceedings 32nd Annual EMSA Meeting, 1974, pages 426, 427) have proposed a corrector for eliminating the aperture aberration, which consists of four quadrupoles with a centrally disposed octupole and one upstream and one downstream octupole. However, this corrector was not able to eliminate chromatic aberrations.

In order to obtain both aperture and chromatic aberration correction, a corrector of the above-mentioned type was constructed on the basis of a proposal by H. Rose ("Abbildungseigenschaften sphärisch korrigierter elektronenmikroskopischer Achromate") (imaging properties of spherically corrected electron microscopic achromates), Optik 33 (1971), pages 1-24) by J. Zach and M. Haider in correspondence with their publication ("Aberration correction in a low voltage SEM by a multipole corrector", Nuclear Instruments and Methods in Physics Research A 363 (1995), 316-325). One problem of such correctors is that they cause aberrations themselves, i.e. aberrations such as astigmatism, stellar aberrations, rosette aberrations, and coma, which occur in different orders. These aberrations should be eliminated to as maximum an extent as possible. Moreover, a corrector of the above-mentioned type corrects only aperture aberrations up to third order. The remaining aperture aberration of fifth order is still disturbing.

WO 2007/065382 proposes a corrector with two corrector elements which are anti-symmetric with respect to a middle plane. Each corrector element comprises five multipoles with five quadruple fields and at least one octupole field (three fields are also possible). In an embodiment thereof, a third multipole element disposed in the symmetry plane can be a twelve-pole element generating an octupole field upon which a twelve-pole field is overlaid. A transfer lens system is disposed between the corrector elements and causes the basic path to enter into the first and second corrector element in the same manner.

In contrast to the corrector mentioned above, this corrector does not operate according for the principle of opening and color error corrections in the region of astigmatic intermediate images, since such images are not created. On the contrary, the corrector corrects such errors in conjugated and morphic planes of the two corrector elements. In the symmetry plane of the two corrector elements in which, according to the above mentioned proposal, the octupole field overlaid with a twelve-pole field is produced, the axial beam emanating from an image point does not have a round beam cross-section as is the case in the above mentioned corrector, rather an elliptical beam cross-section, which is disposed outside of the optical axis. In addition to a correction of four fold astigmatisms of third order, this corrector also causes additional distorting beam influences which are, however, substantially harmless, since the anti-symmetric configuration of the second corrector induces an opposite beam influence to thereby compensate for the distortions. A second corrector in anti-symmetric configuration is therefore absolutely indispensable for the transfer lens system. Moreover, the different principle of functioning than for a corrector of the above mentioned kind without generating an astigmatic intermediate image also requires a completely different beam path, as can be seen from FIGS. 1, 2 and 3.

U.S. Pat. No. 7,015,481 b2 is based on a publication due to J. Zach and M. Haider which deals with the utilization of twelve-poles for the production of the fields mentioned above. However, this document does not suggest introduction of additional multipoles rather regulation of the existing multipoles in order to effect further corrections of errors through use of corresponding fields, in particular opening errors of fifth order. However, the Shew configuration (angular displacement of a pole of a multipole element) which is proposed herein for the correction plays a rather indirect role. It would apparently be most appropriate for use in alignment. It is well-known that errors of fifth order can be influenced by a twelve-pole field. However, a twelve pole field does not result in a satisfactory solution in the event that the twelve pole field is produced at the location of the multipoles, since the elimination of opening errors of fifth order at these locations results in the introduction of additional errors.

It is therefore the underlying purpose of the invention to further develop a corrector of the above-mentioned type in such a fashion that aberrations up to fifth order can preferentially be largely eliminated.

SUMMARY OF THE INVENTION

This object is achieved in accordance with the invention in that the second and the third multipole elements are designed as twelve-pole elements for correcting aberrations of higher order using twelve-pole fields, and that an additional twelve-pole element is inserted between the second and the third multipole element and loaded with current and/or voltage such that an octupole field is generated that is superposed by a twelve-pole field, wherein the configuration of the additional twelve pole element is effected in such a fashion that the octupole field and the twelve pole field are disposed at that location between the astigmatic intermediate images at which the beam cross-section is round.

All fields of the first and fourth multipole elements and the octupole fields and twelve-pole fields of the second and third multipole elements and of the additional twelve-pole element may thereby be magnetic or electric fields, or a combination of both. The statement that the additional twelve-pole element is loaded with current and/or voltage must also be understood in this way. Only the quadrupole fields of the second and third multipole elements must be interacting electric and magnetic fields.

The inventive corrector is initially based on the well-known functions that, according to the teachings of O. Scherzer (loc. it.), the quadrupole field of the first multipole element causes deviations in the beam away from the rotational symmetry, such that the beams diverge differently in two main cross sections that are perpendicular to each other, the x and y cross sections. The subsequent quadrupole field, which is rotated through 90°, of the second multipole element can only influence the beam of one cross section, e.g. the x cross section, which has no zero passage, but not that part of the beam that has a zero passage at that location (y cross section). This cross section (x cross section) is thereby deflected in such a fashion that it extends parallel to the beam of the other cross section, e.g. the y cross section. The other beam part is identically deflected in the quadrupole field of the third multipole element, which is also rotated through 90°, such that the beams of the main cross sections that are perpendicular to each other approach each other again before being combined again to a round beam bundle by the quadrupole field of the fourth multipole element. As mentioned above, the quadruple fields may be magnetic or electric fields or a combination thereof. The mentioned deviations from rotational symmetry are used for chromatic and aperture aberration correction according to the Scherzer theorem (loc. it.).

In practice, the chromatic aberration with respect to one cross section, e.g. the x cross section, is corrected with the second multipole element, and with respect to the other cross section, e.g. the y cross section, with the third multipole element. The function of the chromatic aberration correction corresponds to the well-known Wien filter and is based on the fact that the quadrupole fields consist of superposed electric and magnetic quadrupole fields. The field strengths are thereby designed such that electrons of a certain velocity, i.e. of a certain energy and, in relation to light optics, a certain "color", pass the fields on their predetermined path. The electrons of deviating energies leave the predetermined path and can thereby counter compensate for the chromatic aberration of the round microscope lenses, in particular, the objective lens. A combination of electric and magnetic fields is therefore only required for this chromatic aberration correction.

Aperture aberrations are corrected in the second and the third multipole elements by means of their octupole fields. The aperture aberrations are due to the rotationally symmetrical lenses of the electron microscope, since they have a greater influence on the beams that extend at a larger distance from the optical axis. In consequence thereof, the beams in the area of intermediate images do not form a common point of intersection with the optical axis. The beams of the respective cross section without zero passage can be influenced by the octupole fields in the area of astigmatic intermediate images, such that the beams intersect again in the plane of the image. Aperture aberration correction is completed when the beams of each cross section have been corrected successively, and these beams have subsequently been recombined into a round beam. It is thereby possible to correct aperture aberrations of upstream round lenses as well as pre-compensate for aberrations of downstream round lenses. An aperture aberration is then imposed on the optical path, which is cancelled again by the aperture aberrations of the downstream round lenses, e.g. the objective.

These well-known corrections entail the problem that the corrector itself causes aberrations. These are mainly non rotationally symmetric aberrations, in particular, fourfold astigmatism of third order and a stellar aberration of fifth order. The non rotationally symmetric aberrations form axial image aberration figures and, as mentioned above, are categorized in correspondence with these figures. The remaining round aberration is an aperture aberration of fifth order.

The inventive measures are thereby used to eliminate the above-mentioned aberrations. The attempt to eliminate these aberrations by forming the second and third multipole elements as twelve-poles, did eliminate the stellar aberration of fifth order, with appropriate field adjustment, and greatly reduced the aperture aberration of fifth order, but did not correct the fourfold astigmatism of third order.

Only insertion of an additional twelve-pole element between the second and third multipole elements, with a current and/or voltage load that generates an octupole field that is superposed by a twelve-pole field, permitted correction of all fields up to fifth order except for minor residual aberrations through corresponding setting of the fields, thereby preventing these measures from causing new aberrations.

It has thereby turned out that the additional twelve-pole element is optimally disposed at the location between the astigmatic intermediate images where the beam cross section is round. That is the location where the beam of the x cross section and the beam of the y cross section have the same distance from the optical axis.

In further developments of the invention, the remaining residual aberrations are maximally eliminated. These small residual aberrations are caused by the round lenses located outside of the corrector and are, in particular, an aperture aberration of fifth order which is reduced, but still disturbing.

Towards this end, the invention proposes to associate two transfer lenses designed as round lenses with the corrector on the side of the objective, whose fields can be adjusted in such a fashion that the round aberrations of higher order are eliminated. This measure, however, in turn produces aberrations. In particular, correction of the aperture aberration of third order and also chromatic aberration correction are partially cancelled again. For this reason, the second and third multipole elements are suitably readjusted, wherein both the quadrupole fields and also the octupole fields must be readjusted. For readjusting the quadrupole fields, the magnetic and electric fields must be simultaneously adjusted, such that the chromatic aberration correction is maintained, as described above. A deviation from this simultaneous adjustment is, however, required in so far as a chromatic aberration that recurs due to setting of the transfer lenses must be corrected again.

Insertion of the transfer lenses and any adjustment, such as the above-mentioned readjustment, will change again the optical path, and for this reason, it is suitable to eliminate recurring aberrations of higher order through readjustment of the twelve-pole fields of the second and third multipoles and of the additional twelve-pole element.

Since readjustment of the second and third multipole elements and of the additional twelve-pole element creates again round aberrations of higher order, the transfer lenses must once more be readjusted, and subsequently, the multipole-elements and the twelve-pole element must be readjusted again as described above. Since any adjustment of the above-mentioned elements also causes aberrations, as mentioned above, the above-mentioned individual steps must be iteratively repeated until all aberrations are reduced to a degree that can be tolerated for the desired imaging.

A corrector in accordance with the invention can basically be inserted into any electron microscope that functions in accordance with the scanning principle. The inventive corrector thereby comprises the constructive preconditions, such as spatial construction, windings and material properties as well as the required adjustment ranges for current and/or voltage, for generating and regulating the field strengths of the respective magnetic and/or electric fields in order to be able to perform the described settings and adjustments or readjustments.

The characterization of fields of the corrector to that effect that settings and adjustments or readjustments are possible, means the following: The constructive design of electrodes and/or electromagnets and the possibility of loading them with current or voltage must be such that the stated correction measures can be performed after installation of the corrector into an electron microscope. These settings, adjustments and readjustments are performed after installation and putting the respective electron microscope into operation, since the precise settings depend both on the construction and also on the individual lens aberrations thereof, which individually also occur in electron microscopes of the same series, e.g. through dimensional inaccuracies and material inhomogeneities. Operation of an electron microscope also requires readjustment from time to time, since even the slightest soiling can change the optical properties, requiring readjustment. The invention is realized with a corrector that permits such electron beam corrections. The precise details of the construction of the corrector and the available precise current and/or voltage ranges that are required for the settings and corrections, depend on the design of the respective electron microscope, in particular, on the respective beam voltages of the possible working areas and the precise design of lens system and scanning means.

Since the above-stated properties of the inventive corrector show their effect after installation in an electron microscope, the invention also concerns a scanning electron microscope or scanning transmission electron microscope comprising a corrector of the above-mentioned type, wherein the electron beam was corrected in a manner as described above.

The invention is explained below with reference to the drawing.

DESCRIPTION OF THE PREFERRED EMBODIMENT

Figure 1:
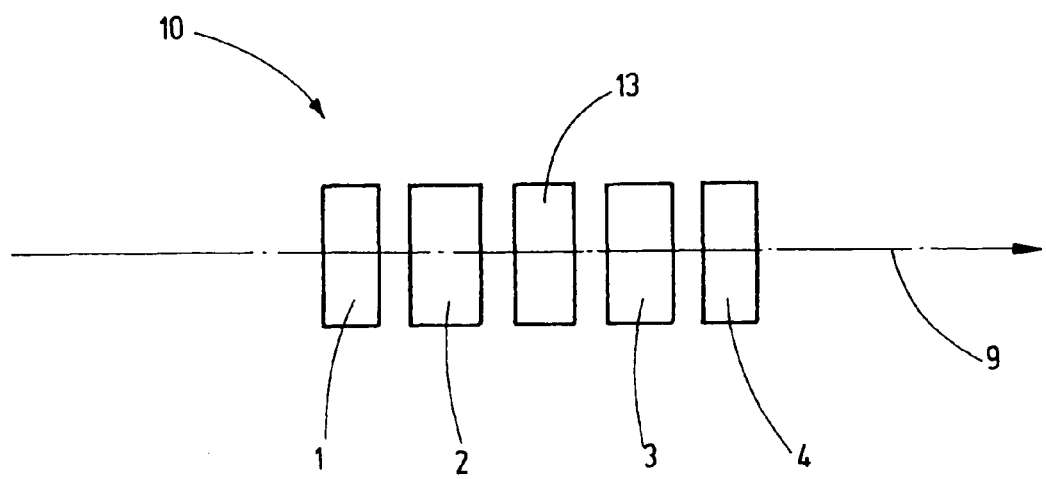
FIG. 1 shows a schematic view of the inventive corrector.

FIG. 1 shows a schematic view of the inventive corrector 10. A first 1 and a second 2 multipole element are disposed in the direction of the optical path 9, followed by a twelve-pole element 13 and then by a third 3 and fourth 4 multipole element.

Figure 2:
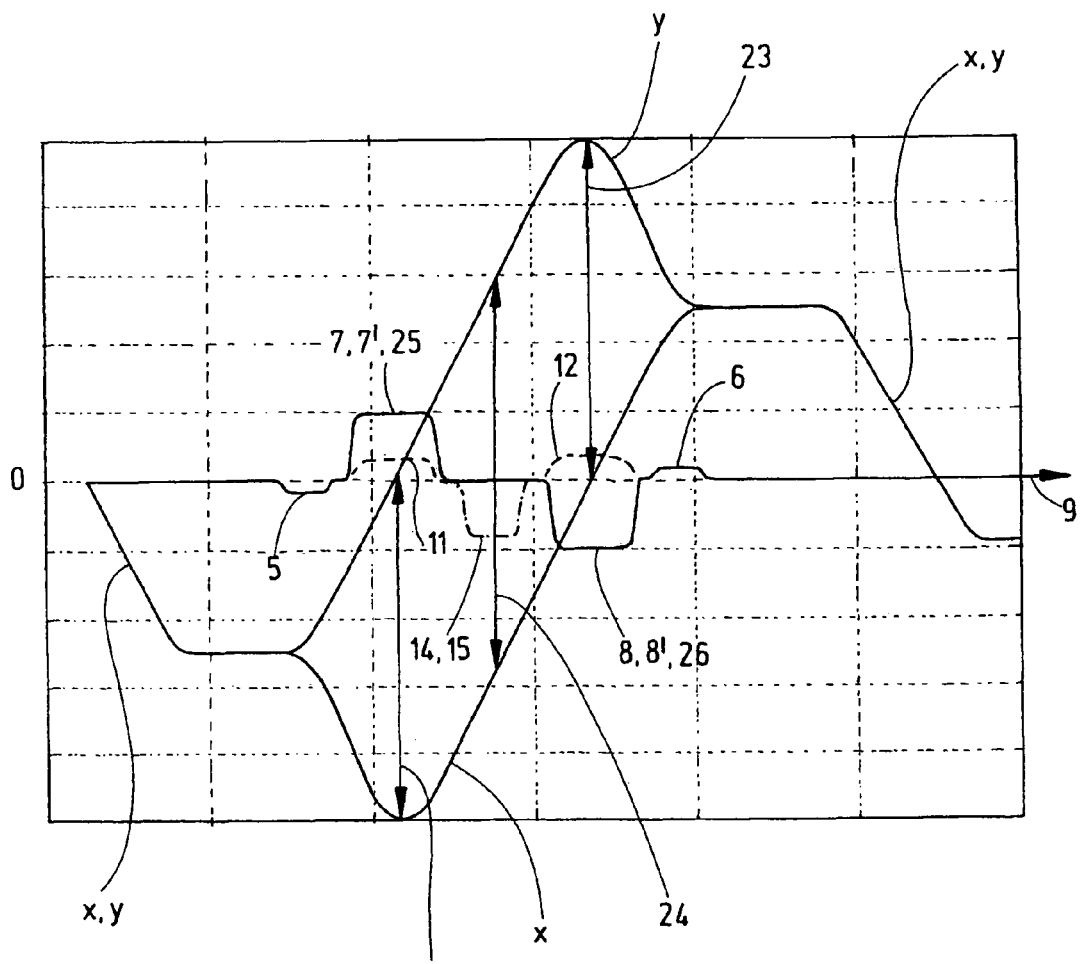
FIG. 2 shows the trajectory of the beams in accordance with FIG. 1 in the x and y planes, and the arrangement of the fields.

FIG. 2 shows the trajectory of the beams of the corrector 10 in two planes disposed perpendicularly to each other, i.e. in x cross section and y cross section, with the optical paths of the curves x and y. FIG. 2 also shows the fields which are generated by the multipole elements 1, 2, 3 and 4 and the twelve-pole element 13. The optical path extends in the direction of arrow 9 and the optical axis 27 extends through the "0" of the perpendicular scale.

As can be gathered from a combination of FIGS. 1 and 2, the first 1 and the fourth 4 multipole elements are designed to generate quadrupole fields 5 and 6. These may be electric or magnetic quadrupole fields 5, 6, or a combination of both. Towards this end, the multipole elements 1 and 4 must comprise at least four electromagnets and/or four electrodes in an axially symmetrical arrangement.

The second 2 and third 3 multipole elements are designed as twelve-pole elements, which can generate electric 7' and 8' and magnetic 7, 8 quadrupole fields in that e.g. the soft iron cores of the electromagnets simultaneously serve as electrodes. The second 2 and third 3 multipole elements are thereby loaded with current for the electromagnets or with a potential for the electrodes, such that these generate magnetic quadrupole fields 7, 8 and electric quadrupole fields 7' and 8', which interact in such a fashion that the above-described chromatic aberration correction can be performed.

Figure 4:
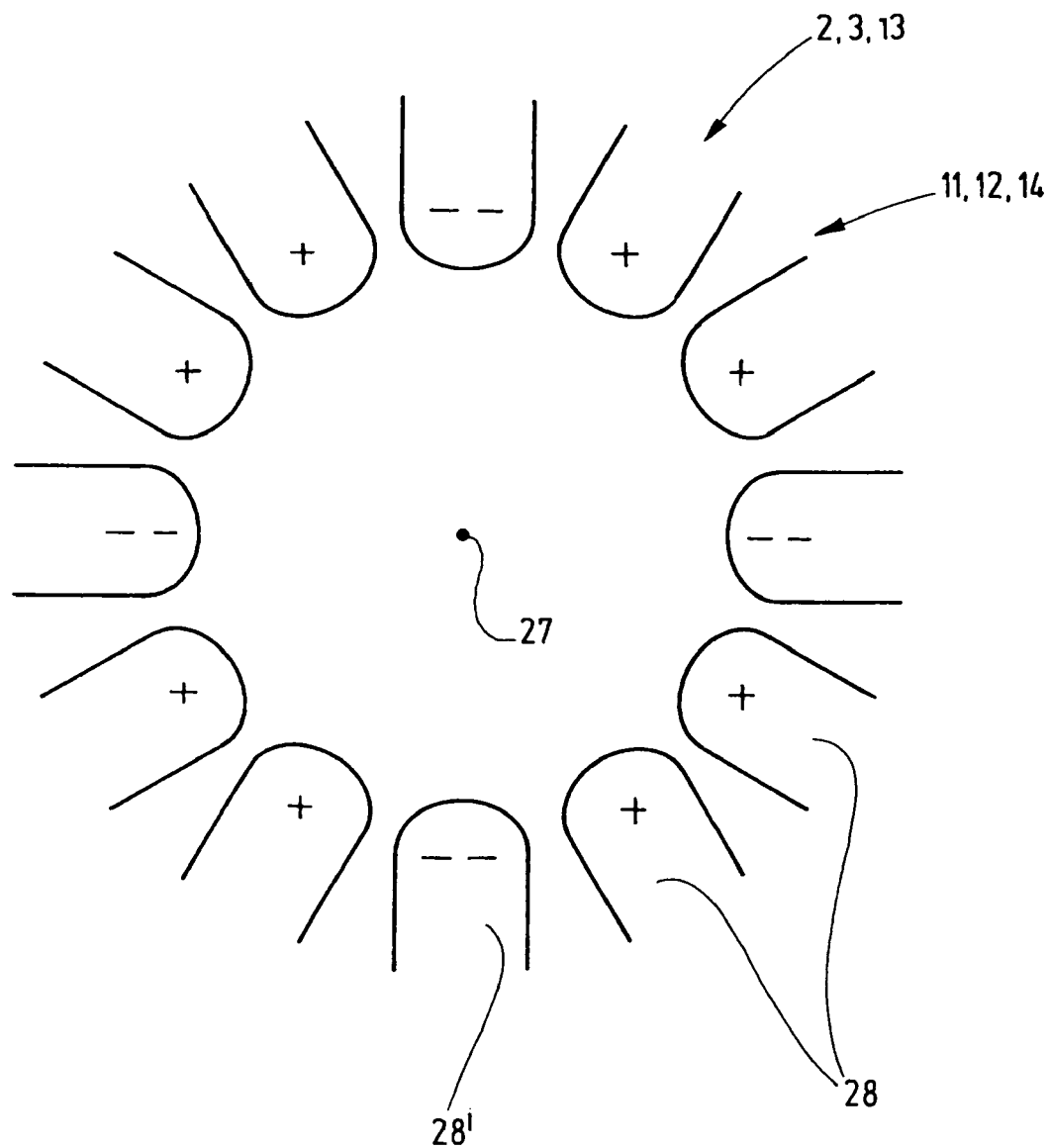
FIG. 4 shows a schematic view of a twelve-pole element that generates an octupole field.

The second 2 and third 3 multipole elements moreover generate twelve-pole fields 25 and 26 and octupole fields 11 and 12 which may also be electric or magnetic fields or a combination of both (FIG. 4 explains how to generate an octupole field with a twelve-pole element). FIG. 2 also shows the twelve-pole field 15 of the twelve-pole element 13 and the octupole field 14 generated thereby.

Formation of an non rotationally symmetric optical path is initially essential for correction of chromatic aberrations and aperture aberrations, comprising astigmatic intermediate images corresponding to the double arrows 22 and 23, since the corrections according to the teaching of Scherzer can thereby be applied (see above). With the astigmatic intermediate image 22, a line focus is generated in the x direction, since the beams of the y cross section have a zero passage in contrast to the beams of the x cross section. In a corresponding fashion, a line focus is generated in the y direction in the astigmatic intermediate image 23. The optical paths are subsequently combined again into a round beam bundle x, y.

The four quadrupole fields 5, 7, 8 and 6 of the multipole elements 1, 2, 3 and 4 are used for generating this optical path, which act like combined cylinder and round lenses in light optics. The quadrupole field 5 of the first multipole element 1 thereby diverges the beams of the x and y cross sections, and the quadrupole field 7 of the second multipole element 2 deflects the x beam at the zero passage of y. In mirror-inverted view, the quadrupole field 8 of the third multipole element 3 deflects the y beam at the zero passage of x, and the quadruple field 6 of the fourth multipole element 4 reunites the beams of the x and y cross sections into a round beam x, y. Towards this end, the quadrupole fields 5, 7, 8 and 6 are each rotated through 90° in the direction of the optical path 9. The x and y cross sections are naturally only used to represent the beam deformation that must be visualized as spatial representation. The situation with such non rotationally symmetric fields is the same as with the cylinder lenses of light optics, wherein it is also possible to eliminate again the induced distortion of the optical path through arrangement of counteracting cylinder lenses. All this serves for correction of chromatic aberrations and aperture aberrations of an electron beam, which is possible only in the region of astigmatic intermediate images in accordance with the Scherzer theorem.

The aperture aberration correction is effected by the octupole fields 11, 12, and the aberrations of higher order including vast reduction of the aperture aberration of fifth order are corrected by the twelve-pole fields 25 and 26 of the second 2 and third 3 multipole elements. A remaining fourfold astigmatism of third order and the remaining aperture aberration of fifth order are then corrected by the twelve-pole field 15 and the octupole field 14 of the additional twelve-pole element 13 in accordance with the invention. These are disposed in the mirror symmetry plane that has a round beam cross section (indicated by the arrow 24) due to the identical amounts of x and y.

Figure 3:
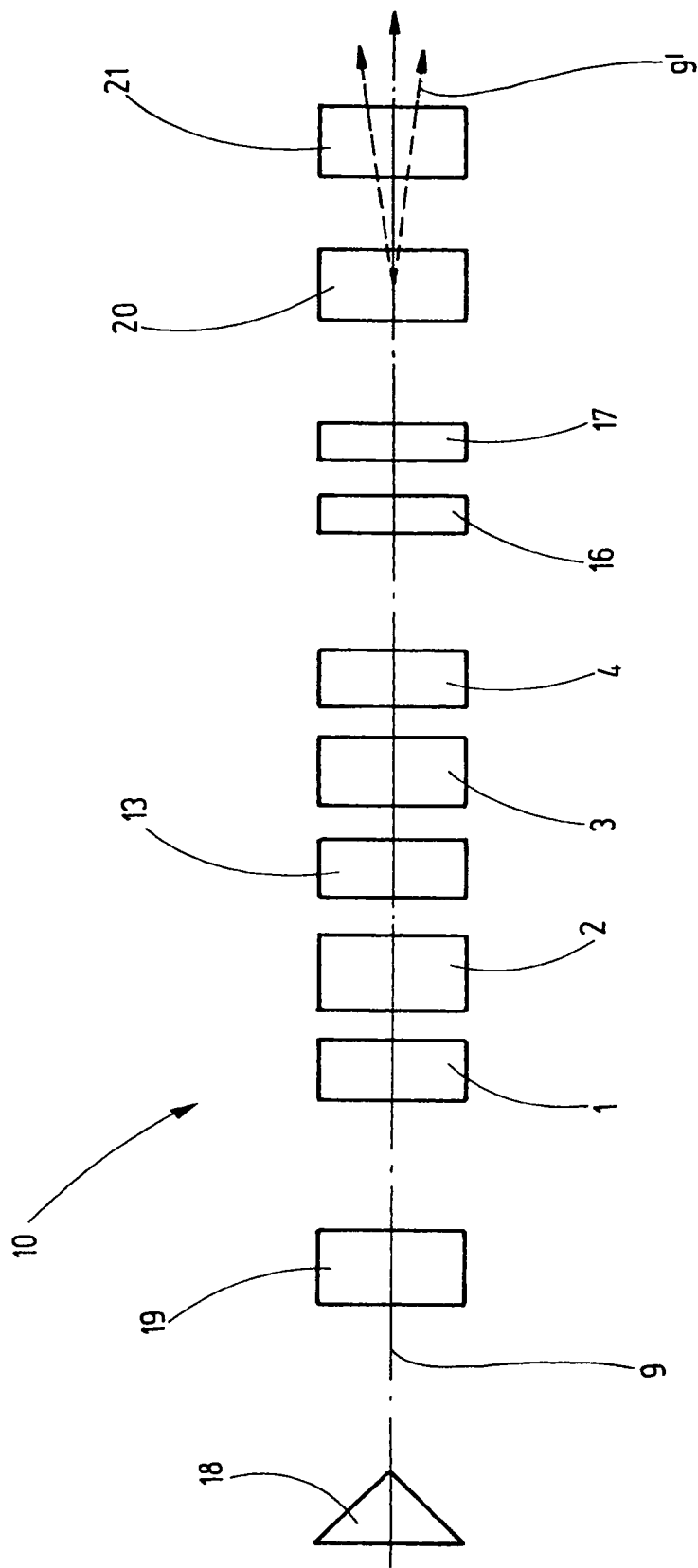
FIG. 3 shows a schematic partial view of an electron microscope with a corrector.

FIG. 3 shows a schematic partial view of an electron microscope which may be a scanning electron microscope or a scanning transmission electron microscope. The inventive corrector 10 is inserted into the optical path 9 downstream of the beam source 18 and the condenser lens 19. The transfer lenses 16 and 17 are disposed downstream of the corrector 10, which comprise round lens fields and the above-described iterative setting that further improves the correction quality of the corrector 10.

The deflection system 20 is disposed downstream of the transfer lenses 16 and 17, for generating the deflected beam 9', i.e. the scanning beam, which is directed onto the object (not shown) using the objective 21. An image of the object is generated by scanning with the scanning beam. The image is generated with a scanning transmission electron microscope (usually called "STEM") in that the scanning beam penetrates through a micro section sample. With the scanning electron microscope (usually called "SEM"), secondary electrodes are reflected from the object through the scanning beam. These are detected by a detector and used for image generation. Modern electron microscopes that function according to the scanning principle are often constructed in such a fashion that they can be operated as a scanning transmission electron microscope or as a scanning electron microscope according to the reflector principle. The inventive corrector 10 is suited for both modes of function.

FIG. 4 shows a schematic view of a twelve-pole element, which may be the second 2 or third 3 multipole element or the additional twelve-pole element 13. The twelve-poles 28, 28' are disposed axially symmetrically about the optical axis 27. If they are used to generate a twelve-pole field, the poles are always consecutively alternately formed as north and south poles in order to generate magnetic fields, or as negatively and positively charged electrodes in order to generate electric fields.

For generating a combination of electric and magnetic fields, the soft iron cores of the electromagnets serve at the same time as electrodes which are loaded with a voltage.

For generating a quadrupole field, three electromagnets or electrodes 28, 28' that have the same polarity or charge, are combined in each case and the groups of three are alternately used as north and south poles or as negatively or positively charged electrodes. Electric and magnetic fields may thereby also be superposed. Such superposition may serve for reinforcement or interaction to obtain chromatic aberration correction in accordance with a Wien filter through magnetic 7, 8 and electric fields 7', 8', as described above.

In contrast thereto, for generating octupole fields 11, 12, or 14, the poles must alternate as represented by the "+" and "−" signs. I.e. two positively charged electrodes 28 and one negatively charged electrode 28' are alternately arranged, wherein the negative charge (symbolized by the two "−" signs) must be accordingly reinforced in order to obtain a preferably undistorted octupole field 11, 12 or 14. For generating a magnetic octupole field, the situation is correspondingly.

Superposed fields, such as quadrupole field, octupole field and twelve-pole field, generated by one single twelve-pole element, are obtained by adding the currents or voltages in the respective poles, i.e. in the electromagnets or electrodes. In this fashion, all above-mentioned field superpositions can be produced.

LIST OF REFERENCE NUMERALS 1,2,3,4 first, second, third and fourth multipole elements
5,6 quadrupole fields of the first and fourth multipole elements
7,8 magnetic quadrupole fields of the second and third multipole elements
7',8' electric quadrupole fields of the second and third multipole elements
9 arrow: optical path
9' arrow: optical path deflected (scanning beam)
10 corrector
11,12 octupole fields of the second and third multipole element
13 additional twelve-pole elements
14 octupole field of the twelve-pole element
15 twelve-pole field of the twelve-pole element
16,17 transfer lenses
18 beam source
19 condenser lens
20 deflection system
21 objective
22 double arrow: first astigmatic intermediate image
23 double arrow: second astigmatic intermediate image
24 arrow: round beam cross section
25 twelve-pole field of the second multipole element
26 twelve-pole field of the third multipole element
27 optical axis
28 electromagnet and/or electrode (south pole or positively charged electrode)
28' electromagnet and/or electrode (north pole or negatively charged electrode

I claim:

1. A corrector for chromatic and aperture aberration correction in a scanning electron microscope or a scanning transmission electron microscope, the corrector comprising:
   a first multipole element generating a quadrupole field;
   a second multipole element disposed downstream of said first multipole element, said second multipole element generating quadrupole, octupole, and twelve pole fields for correcting aberrations of higher order, said quadrupole fields of said second multipole element comprising superposed magnetic and electric fields;
   a third multipole element disposed downstream of said second multipole element, said third multipole element generating quadrupole, octupole, and twelve pole fields for correcting aberrations of higher order, said quadrupole fields of said third multipole element comprising superposed magnetic and electric fields;

a fourth multipole element disposed downstream of said third multipole element, said fourth multipole element generating a quadrupole field; and an additional twelve-pole element disposed between said second and said third multipole elements and supplied with current and/or voltage such that an octupole field is generated that is superposed by a twelve-pole field, wherein said first, second, third, and fourth multipole elements are consecutively disposed in an optical path, quadrupole fields of said first, second, third, and fourth multipole elements being consecutively rotated with respect to one another through 90° to facilitate chromatic aberration correction through interaction between magnetic and electric fields thereof using astigmatic intermediate images in said second and said third multipole elements, wherein aperture aberration correction is effected via quadruple and octupole fields, said additional twelve-pole element being arranged in such a fashion that said octupole and twelve-pole fields thereof are disposed between astigmatic intermediate images at which a beam cross section is round.

2. The corrector of claim 1, further comprising two round transfer lenses on an objective side, said round transfer lenses having fields which can be adjusted in such a fashion that round aberrations of higher order are eliminated.

3. The corrector of claim 2, wherein readjustment of said quadrupole and octupole fields of said second and third multipole elements and of said octupole field of said additional twelve-pole element can be performed in such a fashion as to eliminate chromatic aberration caused by adjustment of said transfer lenses of first order and an aperture aberration of third order.

4. The corrector of claim 3, wherein said twelve-pole fields of said second and third multipoles and of said additional twelve-pole element can be readjusted to eliminate aberrations of higher orders caused by readjustment of said second and third multipole elements and of said additional twelve-pole element.

5. The corrector of claim 4, wherein chromatic errors of first order, aperture errors of third order, and aberrations of higher order can be eliminated through readjustment of said transfer lenses, said quadrupole fields, said octupole fields, and subsequently of said twelve-pole fields, as well as through iterative readjustment thereof for reducing aberrations caused by respective previous adjustments, until said aberrations are reduced to an amount that can be tolerated for a desired imaging.

6. A scanning electron microscope or scanning transmission electron microscope having the corrector of claim 1.

* * * * *